United States Patent [19]

Kruppa

[11] Patent Number: 5,170,328
[45] Date of Patent: Dec. 8, 1992

[54] PACKAGING FOR MOLDED CARRIERS OF INTEGRATED CIRCUITS

[75] Inventor: Victor D. Kruppa, Kokomo, Ind.

[73] Assignee: Delco Electronics Corporation, Kokomo, Ind.

[21] Appl. No.: 513,244

[22] Filed: Apr. 24, 1990

[51] Int. Cl.$^5$ .............................................. H05K 1/00
[52] U.S. Cl. ................................... 361/398; 361/408;
   361/417; 361/419; 361/420; 361/212; 361/421;
   174/52.4; 257/668
[58] Field of Search ............... 206/330, 331, 332, 334,
   206/343, 460; 361/398, 408, 417, 419, 420, 421,
   212; 174/52.4, 261, 268; 357/70, 80

[56] References Cited

U.S. PATENT DOCUMENTS

| | | | |
|---|---|---|---|
| 3,766,439 | 10/1973 | Isaacson | 361/398 |
| 4,562,924 | 1/1986 | Okamoto | 206/330 |
| 4,617,605 | 10/1986 | Obrecht et al. | 361/212 X |
| 4,928,206 | 5/1990 | Porter et al. | 361/398 X |

OTHER PUBLICATIONS

DE-A-1 486 312 (Ets Krieg & Zivy) * p. 5, paragraphs 1,2; p. 6, paragraph 2; FIGS. 1,3,5 *-No Translation.
GB-A-1 399 358 (Rowe International) * p. 2, lines 23-29,79-82; FIG. 1 *-No Translation.
DE-U-8 713 163 (Siemens) * p. 2, lines 1-7; p. 2, line 37-p. 3, line 7 *-No Translation.
Elektronik vol. 30, No. 21, Oct. 1981, pp. 104-110, Munchen, DE; R. Hecker: "Gegurtete Bauelemente fur die automatische Bestuckung" * p. 107, left-hand column, last paragraph-p. 108, left-hand column, last paragraph; FIG. 7 *-No Translation.
European Search Report on European Application No. EP 89 30 6821 dated Jul. 1, 1991.
Annex to the European Search Report on European Application No. EP 91 20 0788.

*Primary Examiner*—Leo P. Picard
*Assistant Examiner*—Paramita Ghosh
*Attorney, Agent, or Firm*—Cary W. Brooks

[57] ABSTRACT

A package is provided for connecting a plurality of molded carriers each having an integrated circuit which has been previously bonded to the electrical leads of a TAB tape. The package flexibly and sequentially connects a plurality of the carriers, so as to form a flexible and continuous chain of the carriers. The package preferably utilizes a flexible conductive tape which is continuously provided on parallel ends, or edges, of each carrier, so as to link the plurality of carriers together. The package permits continuous feeding of the carriers into subsequent test and assembly machines utilized to attach the integrated circuit to a printed circuit board.

12 Claims, 1 Drawing Sheet

PACKAGING FOR MOLDED CARRIERS OF INTEGRATED CIRCUITS

This invention generally relates to the packaging of integrated circuits prior to mounting on a printed circuit board. More specifically, this invention relates to the packaging of molded carriers used for testing and transporting of these integrated circuits during assembly of a printed circuit incorporating the integrated circuit.

BACKGROUND OF THE INVENTION

Many methods are known for forming the electrical interconnections between an integrated circuit and the supporting substrate. Tape automated bonding (TAB) is one commonly known method for forming these such electrical interconnections. A TAB tape is provided which is made up of many identical electrical lead configurations sequentially patterned along the tape.

The electrical lead pattern comprises many individual long, slender leads attached to, and extending radially inward from, the perimeter of the TAB tape material. The integrated circuit is provided within the center of the TAB tape and gang bonded to each of the electrical leads. After bonding between the integrated circuit and electrical leads is complete, the integrated circuit is excised from the TAB tape. The integrated circuit is subsequently mounted on an appropriate printed substrate, if this has not already been done, and accordingly bonded to the substrate.

The integrity of the individual integrated circuit assemblies must be maintained throughout processing, but particularly during the period after the integrated circuit has been bonded to the electrical leads but not yet excised from the TAB tape. During this period, the TAB tape, integrated circuit and patterned slender electrical leads must be maintained in a substantially planar manner to ensure the integrity of the assembly for subsequent attachment of the integrated circuit to an appropriate substrate. Therefore, generally, a carrier ring or other device which fits around the perimeter of the TAB tape to retain the integrated circuit and electrical leads is utilized. The carrier is typically formed from a molded plastic or other material which is relatively inexpensive, yet durable. After molding, the carrier assembly having the integrated circuit and leads is fed into an assembly machine which then excises the integrated circuit and leads from the carrier and mounts the integrated circuit onto an appropriate printed circuit.

During assembly and transport, these carrier assemblies are generally stacked vertically or horizontally and individually fed into the assembly machine. However, this method results in several disadvantages. Firstly, complex packaging and feed systems are required to handle the individual carrier units, since the individual units are not amenable to use with conventional tape and reel packaging methods. Secondly, it is expensive to package each unit individually. Lastly, there is added waste and bulk as a result of the individual packaging for each unit.

It is desirable therefore to provide a means for packaging these carrier assemblies which is amenable to the automatic feed handling systems used to attach the integrated circuit within the carrier unit to a printed circuit board, wherein the carrier assemblies would be provided in a continuous manner. It is also desirable that the method for packaging be simplistic in design and relatively inexpensive. Lastly, it is desirable that the packaging method not generate undue waste.

SUMMARY OF THE INVENTION

It is an object of the present invention to provide means for packaging a plurality of carrier assemblies each having an integrated circuit which has been bonded to the electrical leads within a TAB tape.

It is a further object of this invention that such packaging means provide a flexible and continuous chain of these carriers.

In accordance with a preferred embodiment of this invention, these and other objects and advantages are accomplished as follows.

I have prepared a package for molded carriers having an integrated circuit which has been previously bonded to the electrical leads of a TAB tape. The package flexibly and sequentially connects a plurality of the carriers, so as to form a flexible and continuous chain of the carriers. The packaging means preferably utilizes a flexible conductive tape which is continuously provided on parallel ends, or edges, and on the top and bottom surface of each carrier, so as to link the plurality of carriers together.

An inventive feature of this invention is that the flexible chain of carriers permits the carriers to be fed continuously into subsequent test and assembly machines utilized to attach the integrated circuit to a printed circuit board. In addition, the cost associated with this means of packaging, instead of conventional individual packaging units, is relatively inexpensive. Further, this means for packaging generates lesser amounts of waste.

Other objects and advantages of this invention will be better appreciated from a detailed description thereof, which follows.

BRIEF DESCRIPTION OF THE DRAWINGS

The above and other advantages of this invention will become more apparent from the following description taken in conjunction with the accompanying drawings wherein.

DETAILED DESCRIPTION OF THE INVENTION

A package is provided for testing and transporting molded carriers having an integrated circuit which has been previously bonded to the electrical leads of a TAB tape. The package provides a flexible and continuous chain of the carriers, which permits the carriers to be fed continuously into subsequent test and assembly machines utilized to attach the integrated circuit to a printed circuit board.

Figure 1:
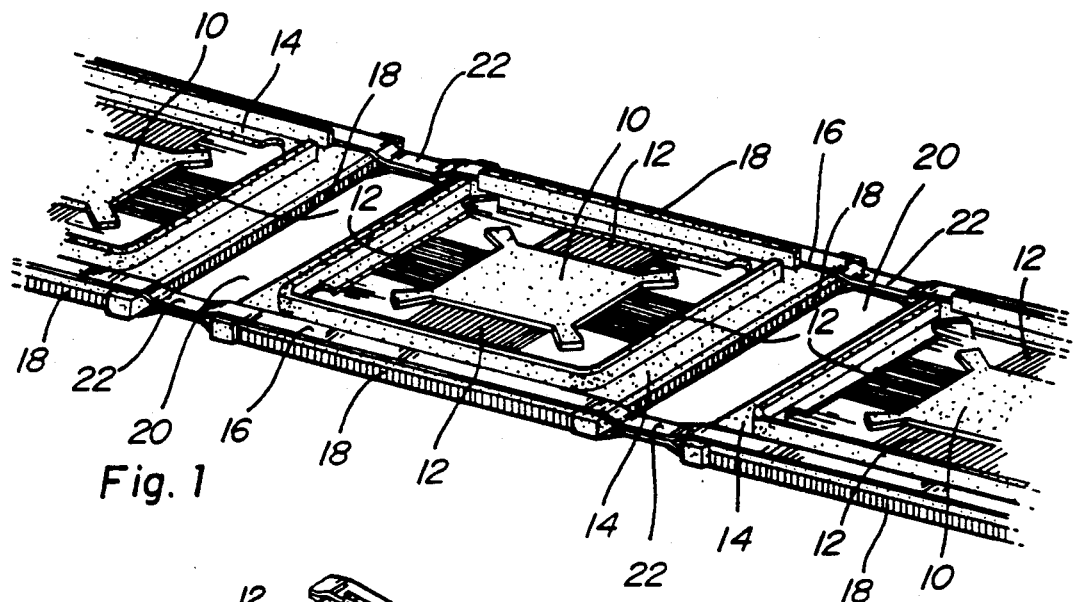
FIG. 1 is a perspective view of the packaging means for use with a carrier of an integrated circuit in accordance with a preferred embodiment of this invention.

As shown in FIG. 1, an integrated circuit 10 is bonded to electrical leads 12. The electrical leads 12 were integral with and provided by a TAB tape. The integrated circuit 10 and electrical leads 12 are maintained in a substantially planar manner by a molded carrier ring 14. The molded carrier ring 14 is formed from a molded plastic after the integrated circuit 10 has been bonded to the electrical leads 12. The carrier 14 may be formed from any material which is durable, electrically dielectric and relatively inexpensive, such as a plastic.

A plurality of the carriers 14 are connected by means of a flexible tape 16 which is provided on parallel ends 18, or the edges, of each carrier 14. The flexible tape 16 is also provided on the top and bottom surface of the carrier 14 along the edges 18. The tape 16 adheres to the surface of the carrier 14 where it is provided.

The carriers 14 are spaced a predetermined distance apart from each other, so that a gap 20 exists between each carrier 14. The size of the gap 20 is determined by the requirements of the subsequent processing machines and tolerances. Theoretically, the gap 20 could be quite large, however, for practical purposes it is desirable that the gap 20 be one to two times the thickness of the carrier 14. With a gap 20 of this preferred dimension, the chain of carriers 14 is still flexible, yet is not unduly cumbersome. If the gap 20 is too large, the flexible tape 16 may become entangled or tear, while if the gap 20 is too small, there may not be enough flexibility between the carriers 14 which may hinder subsequent processing of the carriers 14 and integrated circuits 10.

Figure 2:
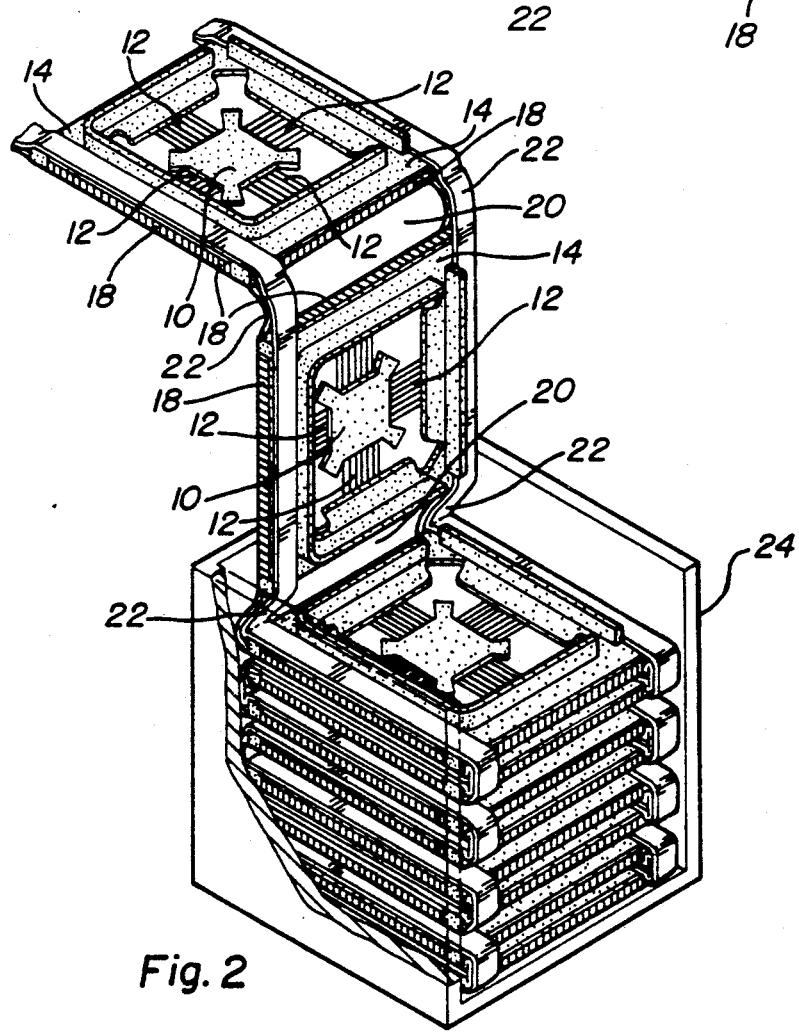

As shown in FIG. 1, the flexible tape 16 links an indefinite number of carriers 14 together. At the gap 20, the flexible tape 16 forms a flexible link 22 between carriers 14. The link 22 is formed by the oppositely disposed tapes 16 provided on the top and bottom surfaces of the carrier 14 along the edges 18 of the carrier 14. The flexible links 22 permit the carriers 14 and integrated circuits 10 to fold over one another or be hinged similar to a chain. This allows the carriers 14 to be transported, stored and dispensed from a protective container having the carriers 14 layered within the container 24, similar to the manner in which continuously fed ammunition is stored (see FIG. 2). The carriers 14 may then be continuously fed, instead of individually fed, into an assembly machine, such as a trim and form machine. In practice, after assembly or test at a particular machine, the integrated circuit 10 would be excised from the carrier 14. The carrier 14 having the flexible tape 16 could then be discarded.

It is preferred that the tape 16 be formed from a material which does not deteriorate with age, does not cause damage to the integrated circuit and other components through outgassing, does not generate an electrostatic discharge, and protects the components from electrostatic discharge generated elsewhere by being electrically conductive or at least conductive to static electricity. A preferred material for the flexible tape is a metallized polyester with an acrylic adhesive backing. The preferred metal is aluminum or nickel, although a conductive PVC or polystyrene may also be used on an acrylic adhesive. It is preferred that the acrylic adhesive be pressure sensitive for ease in applying the tape to the carriers, however, it is foreseeable that the adhesive may be heat sensitive and applied by exposing to an appropriate temperature.

It is also foreseeable that the tape 16 could be provided only at the gap 20 region. Therefore, it would not need to run the entire length of the carrier's 14 edges. The tape 16 would be provided on the carrier 14 near the gap 20 in an amount sufficient to ensure good adherence of the tape 16 and carrier 14. This variation would consume less amounts of the tape 16, however, it may prove more difficult to produce than the continuously provided tape 16 shown in the figure.

Advantages of this method for packaging the carriers 14 are many. The packaging permits the carriers 14 to be fed continuously into subsequent assembly machines utilized to attach the integrated circuit to a printed circuit board. In addition, the costs associated with this means of packaging, instead of conventional individual packaging units, are relatively inexpensive. Also, a high packing density of the carriers 14 is obtained and less refuse is generated.

While the invention has been described in terms of a preferred embodiment using TAB tape technology, it is apparent that other forms could be adopted by one skilled in the art, such as the of a different tape material or such as the use of integrated circuits which have been previously wire bonded to an electrical lead frame. Accordingly, the scope of the invention is to be limited only by the following claims.

The embodiments of the invention in which an exclusive property or privilege is claimed are defined as follows:

1. A package for carriers of integrated circuits for handling the integrated circuit prior to attachment to a printed circuit board comprising:

a plurality of integrated circuits, each of said integrated circuits having a plurality of electrical leads attached to and extending outwardly from said integrated circuit;

a plurality of carriers, each of said carriers retaining an individual integrated circuit by rigidly retaining in a substantially planar direction all of said plurality of electrical leads attached to and extending outwardly from said integrated circuit; and means for flexibly and sequentially connecting said plurality of carriers to another of said carriers so as to form a flexible chain of said carriers and so that said carriers can be folded over one another, wherein said means for flexibility and sequentially connecting said plurality of carriers to each other comprises an electrically conductive material.

2. A package for integrated circuits as recited in claim 1 wherein said means for flexibly and sequentially connecting said plurality of carriers to each other comprises an adhesive tape.

3. A method for packaging carriers of integrated circuits for handling the integrated circuit prior to attachment to a printed circuit board comprising the following steps:

providing a plurality of integrated circuits each having a plurality of electrical leads attached to and extending outwardly from said integrated circuit;

retaining said plurality of electrical leads attached to and extending outwardly from each of said integrated circuits in a substantially planar manner by a carrier ring; and connecting each of said carrier rings to another by means of a flexible link, so that the carrier rings are flexibly and sequentially connected to form a chain and so that said carriers can be folded over one another, wherein said flexible link within said connecting step comprises an electrically conductive tape.

4. A method for packaging carriers of integrated circuits as recited in claim 3 wherein said flexible link within said connecting step comprises an adhesive tape.

5. A package for carriers of integrated circuits comprising:

a plurality of integrated circuits, each of said integrated circuits having a plurality of electrical leads attached to and extending outwardly from said integrated circuits;

at least two adjacently positioned carriers, each of said carriers retaining an individual integrated circuit by rigidly retaining in a substantially planar direction all of said plurality of electrical leads attached to and extending outwardly from said integrated circuit; each of said carriers having top and bottom surfaces and each of said surfaces having first and second opposed edges; and first, second, third and fourth strips of adhesive tape, said first adhesive tape having a portion adhering to a portion of the top surface near said first edge of each of said adjacent carriers and having a portion extending between said adjacent carriers, said second adhesive tape having a portion adhering to a portion of the bottom surface near said first edge of each of said adjacent carriers and having a portion extending between said adjacent carriers, said first and second adhesive tapes being secured together a distance along said portion extending between said carriers to form a flexible hinge, said third adhesive tape having a portion adhering to a portion of the top surface near said second edge of each of said adjacent carriers and having a portion extending between said adjacent carriers, said fourth adhesive tape having a portion adhering to a portion of the bottom surface near said second edge of each of said adjacent carriers and having a portion extending between said adjacent carriers, said third and fourth adhesive tapes being secured together a distance along said portion extending between said carriers to form a flexible hinge.

6. A package as set forth in claim 5 wherein said adhesive tape extending between adjacent carriers is of sufficient length so that said carriers can be folded over one another.

7. A package as set forth in claim 5 wherein said adhesive tape is electrically conductive.

8. A package as set forth in claim 5 wherein said adhesive tape has adhesive only on one side.

9. A package as set forth in claim 5 wherein said adhesive tape has adhesive on only one side and electrically conductive surface on the other side.

10. A package as set forth in claim 5 wherein each of said carriers has substantially identical widths and said adjacent positioned carriers are spaced apart a distance slightly greater than twice the width of said carrier so that said carriers may be folded over one another and may be positioned and maintained in substantially identical superimposed positions.

11. A package as set forth in claim 5 wherein said adhesive tape comprises a metallized polyester with an acrylic adhesive backing.

12. A package as set forth in claim 5 wherein said tape does not run the entire length of the carrier's edge.

* * * * *